(12) United States Patent
Ahn et al.

(10) Patent No.: US 8,406,032 B2
(45) Date of Patent: Mar. 26, 2013

(54) MEMORY DEVICES AND METHODS OF OPERATING THE SAME

(75) Inventors: Seung-eon Ahn, Hwaseong-si (KR); Young-bae Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 293 days.

(21) Appl. No.: 12/801,830

(22) Filed: Jun. 28, 2010

(65) Prior Publication Data

US 2011/0149633 A1 Jun. 23, 2011

(30) Foreign Application Priority Data

Dec. 23, 2009 (KR) .................. 10-2009-0130035

(51) Int. Cl.
*G11C 11/22* (2006.01)
(52) U.S. Cl. ........ 365/145; 365/148; 257/295; 257/288; 257/325
(58) Field of Classification Search .................. 365/145, 365/148; 257/295, 288, 325
See application file for complete search history.

(56) References Cited

U.S. PATENT DOCUMENTS

| | | | | |
|---|---|---|---|---|
| 6,013,950 A * | 1/2000 | Nasby | ............................. | 257/734 |
| 6,810,575 B1 * | 11/2004 | Saito et al. | .................. | 29/592.1 |
| 6,872,995 B2 * | 3/2005 | Hase | ............... | 257/295 |
| 6,965,137 B2 * | 11/2005 | Kinney et al. | .................. | 257/295 |
| 7,329,915 B2 * | 2/2008 | Herman et al. | ............... | 257/288 |
| 7,352,605 B2 * | 4/2008 | Kang et al. | .................... | 365/145 |
| 7,573,083 B2 * | 8/2009 | Kijima et al. | ................. | 257/295 |
| 7,580,276 B2 * | 8/2009 | Sawa et al. | ..................... | 365/148 |
| 7,629,198 B2 * | 12/2009 | Kumar et al. | .................. | 438/104 |
| 7,633,790 B2 * | 12/2009 | Rinerson et al. | .............. | 365/148 |
| 7,678,607 B2 * | 3/2010 | Chiang et al. | .................. | 438/104 |
| 7,719,001 B2 * | 5/2010 | Nomura et al. | .................. | 257/40 |
| 7,989,791 B2 * | 8/2011 | Kang et al. | ......................... | 257/2 |
| 8,034,680 B2 * | 10/2011 | Kim et al. | ....................... | 438/237 |
| 8,125,021 B2 * | 2/2012 | Cho et al. | ......................... | 257/325 |
| 8,148,765 B2 * | 4/2012 | Shim et al. | ...................... | 257/310 |
| 8,203,863 B2 | 6/2012 | Kim et al. | | |

FOREIGN PATENT DOCUMENTS

| | | |
|---|---|---|
| JP | 05-347422 | 12/1993 |
| JP | 07-014990 | 1/1995 |
| JP | 07-263646 | 10/1995 |
| KR | 10-0773537 | 10/2007 |
| KR | 10-2009-0018504 | 2/2009 |
| KR | 10-2010-0024800 | 3/2010 |

OTHER PUBLICATIONS

J. Joshua Yang et al., "Memristive switching mechanism for metal/oxide/metal nanodevices," Hewlett-Packard Laboratories, Palo Alto, California 94304, USA. Jun. 15, 2008, Macmillan Publishers Limited. pp. 429-433.

* cited by examiner

*Primary Examiner* — Viet Q Nguyen
(74) *Attorney, Agent, or Firm* — Harness, Dickey & Pierce, P.L.C.

(57) ABSTRACT

Memory devices and methods of operating the same. A memory cell of a memory device may include a ferroelectric layer and a semiconductor layer bonded to each other. The ferroelectric layer may be of a p-type and the semiconductor layer may be of an n-type. The memory cell may have a switching characteristic due to a depletion region that exists in a junction between the ferroelectric layer and the semiconductor layer. The memory device may be a device writing data using a polarization change of the ferroelectric layer.

18 Claims, 7 Drawing Sheets

MEMORY DEVICES AND METHODS OF OPERATING THE SAME

CROSS-REFERENCE TO RELATED APPLICATION

This application claims the benefit of Korean Patent Application No. 10-2009-0130035, filed on Dec. 23, 2009, in the Korean Intellectual Property Office (KIPO), the entire contents of which is incorporated herein by reference.

BACKGROUND

1. Field

Example embodiments relate to memory devices and methods of operating the same.

2. Description of the Related Art

Among a variety of types of non-volatile memory devices, a resistive memory device is a memory device operating based on resistance change characteristics of a material, such as a transition metal oxide, of which resistance is significantly changed at a particular voltage level. That is, the resistance of a resistance-change material decreases when a voltage greater than or equal to a set voltage is applied thereto. This refers to an ON state. In addition, the resistance of the resistance-change material increases when a voltage greater than or equal to a reset voltage is applied thereto. This refers to an OFF state.

Generally, a resistive memory device includes a storage node having a resistance-change layer and a switching device electrically connected to the storage node. The storage node and the switching device are connected to each other via an intermediate electrode. The switching device controls signal access to the storage node.

The need for high integration and high performance of various non-volatile memory devices such as resistive memory devices has increased.

SUMMARY

Example embodiments include memory devices that may be highly integrated and exhibit excellent and/or improved performance, and methods of operating the same.

According to example embodiments, a memory device includes a first memory cell including a p-type ferroelectric layer and an n-type oxide semiconductor layer, a depletion region at a junction between the p-type ferroelectric layer and the n-type oxide semiconductor layer, a first electrode connected to the p-type ferroelectric layer and a second electrode connected to the n-type oxide semiconductor layer.

According to example embodiments, a memory device includes a first memory cell including a p-type ferroelectric layer and an n-type oxide semiconductor layer which are bonded to each other and having a switching characteristic due to a depletion region existing in a junction between the p-type ferroelectric layer and the n-type oxide semiconductor layer, a first electrode connected to the p-type ferroelectric layer and a second electrode connected to the n-type oxide semiconductor layer.

The p-type ferroelectric layer may include an oxide. The p-type ferroelectric layer may include at least one selected from the group consisting of PbZrTiO, BaTiO, PbTiO, BiLaTiO, BiTiNbO, PbGeO, PbMnTeO, PbCoTeO, PbMnReO, and PbMnNbO. The n-type oxide semiconductor layer may include a binary oxide. The n-type oxide semiconductor layer may include at least one selected from the group consisting of a zinc (Zn) oxide, a titanium (Ti) oxide, a tantalum (Ta) oxide, a hafnium (Hf) oxide, a tungsten (W) oxide, an aluminum (Al) oxide, a niobium (Nb) oxide, and a zirconium (Zr) oxide. The n-type oxide semiconductor layer may include an amorphous complex oxide having ternary or more components. The p-type ferroelectric layer may be thicker than the n-type oxide semiconductor layer. The thickness of the p-type ferroelectric layer may be about twice to 20 times larger than that of the n-type oxide semiconductor layer.

The first electrode may make an ohmic contact with the p-type ferroelectric layer, and the second electrode may make an ohmic contact with the n-type oxide semiconductor layer. A plurality of the first electrodes having a wiring shape may be aligned parallel to each other, a plurality of the second electrodes having a wiring shape may be aligned parallel to each other so as to cross the first electrodes, and the first memory cell may be disposed at each cross-point between the first and second electrodes. The memory device may further include a plurality of third electrodes having a wiring shape and aligned parallel to each other so as to cross the second electrodes and a second memory cell disposed at each cross-point between the second and third electrodes, the second memory cell including a p-type ferroelectric layer and an n-type oxide semiconductor layer bonded to each other. The second memory cell may have the same or inversed stack structure of the first memory cell.

According to example embodiments, a method of operating the memory device includes applying a first voltage to the first memory cell so that the p-type ferroelectric layer has a first polarization state and applying a second voltage to the first memory cell so that the p-type ferroelectric layer has a second polarization state, the memory device including a first memory cell including a p-type ferroelectric layer and an n-type oxide semiconductor layer which are bonded to each other and having a switching characteristic due to a depletion region existing in a junction between the p-type ferroelectric layer and the n-type oxide semiconductor layer, a first electrode connected to the p-type ferroelectric layer and a second electrode connected to the n-type oxide semiconductor layer.

One of the first and second voltages may be a positive (+) voltage, and the other is a negative (−) voltage. The applying the first voltage and the second voltage may be a data write or erase operation. The method may further include reading data of the first memory cell, the reading the data of the first memory cell including measuring an electrical resistance of the first memory cell, the electrical resistance of the first memory cell varying according to the polarization of the p-type ferroelectric layer.

BRIEF DESCRIPTION OF THE DRAWINGS

Example embodiments will be more clearly understood from the following brief description taken in conjunction with the accompanying drawings.

FIG. 1 is a cross-sectional diagram of a unit structure of a memory device according to example embodiments;

FIG. 2 is an energy band diagram of a p-type ferroelectric layer and an n-type oxide layer included in a unit structure of a memory device before a voltage is applied to the unit structure according to example embodiments;

FIG. 3 is an energy band diagram of a p-type ferroelectric layer and an n-type oxide layer included in a unit structure of a memory device when a reverse bias is applied to the unit structure according to example embodiments;

FIG. 4 is a cross-sectional diagram of a unit structure of a memory device illustrating a polarization state of a p-type ferroelectric layer when a reverse bias is applied to the unit structure according to example embodiments;

FIG. 5 is a cross-sectional diagram of a unit structure of a memory device illustrating a polarization state of a p-type ferroelectric layer when a forward bias is applied to the unit structure according to example embodiments;

FIG. 6 is a graph illustrating voltage (V)—current (A) characteristics of a memory device according to example embodiments;

FIGS. 7 and 8 are perspective views of memory devices having array structures according to example embodiments;

FIG. 9 is a schematic diagram roughly illustrating a memory card 500 according to example embodiments; and FIG. 10 is a block diagram roughly illustrating an electronic system 600 according to example embodiments.

Figure 1:
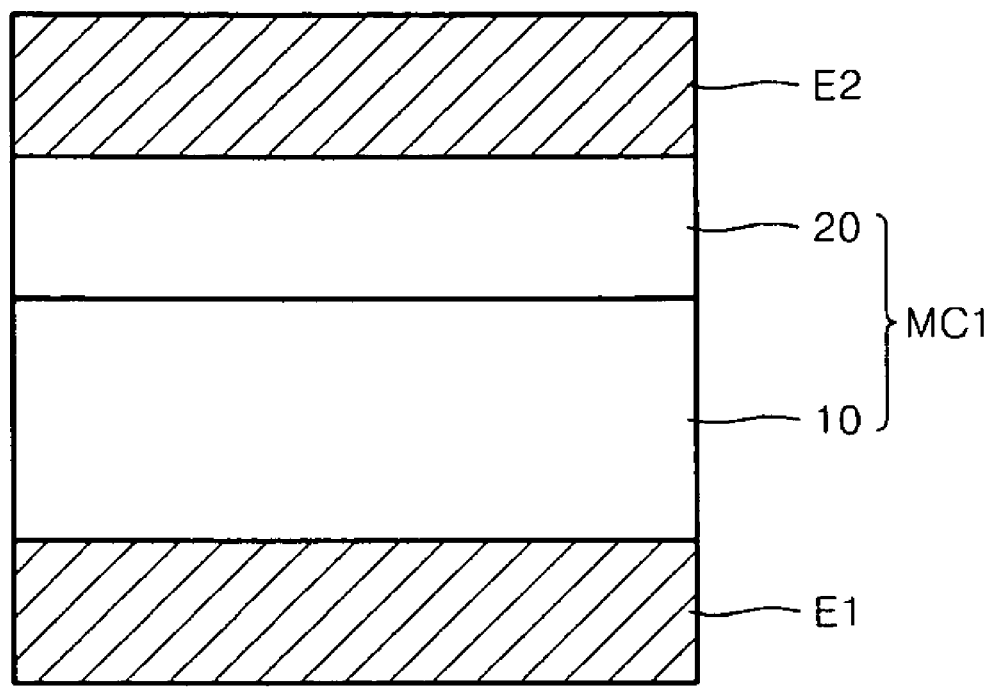
FIGS. 1-10 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional diagram of a unit structure of a memory device according to example embodiments. Referring to FIG. 1, the memory device may include a memory cell MC1 between a first electrode E1 and a second electrode E2. The memory cell MC1 may have a stack structure including a p-type ferroelectric layer 10 and an n-type oxide semiconductor layer (hereinafter referred to as "n-type oxide layer") 20. As illustrated in FIG. 1, the p-type ferroelectric layer 10, the n-type oxide layer 20 and the second electrode E2 may be sequentially stacked on the first electrode E1. The positions of the p-type ferroelectric layer 10 and n-type oxide layer 20 may be exchanged.

An electrical resistance of the memory cell MC1 may vary according to a voltage applied thereto. For example, the memory cell MC1 may be in a low resistance state or a high resistance state according to the voltage applied thereto. The low resistance state may correspond to data '0' and the high resistance state may correspond to data '1'. The resistance change of the memory cell MC1 may be caused by at least, for example, a change of dielectric polarization (hereinafter referred to as "polarization") of the p-type ferroelectric layer 10. A memory device according to example embodiments may be a device that stores data using a phenomenon that electrical resistance of the memory cell MC1 changes according to polarization of the p-type ferroelectric layer 10. The memory cell MC1 may have a switching characteristic (e.g., rectifying characteristic) caused by a depletion region in a junction between the p-type ferroelectric layer 10 and the n-type oxide layer 20. The junction structure of the p-type ferroelectric layer 10 and the n-type oxide layer 20 may have a rectifying characteristic as a pn diode. The memory cell MC1 may be a multi-functional unit having memory and switching characteristics.

The p-type ferroelectric layer 10 may include an oxide. For example, the p-type ferroelectric layer 10 may be an oxide layer. The p-type ferroelectric layer 10 may include at least one of PbZrTiO, BaTiO, PbTiO, BiLaTiO, BiTiNbO, PbGeO, PbMnTeO, PbCoTeO, PbMnReO and PbMnNbO. These materials may be p-type ferroelectric materials in which holes act as majority carriers due to oxygen deficiencies. The n-type oxide layer 20 may include a binary oxide. The n-type oxide layer 20 may include at least one of a zinc (Zn) oxide, a titanium (Ti) oxide, a tantalum (Ta) oxide, a hafnium (Hf) oxide, a tungsten (W) oxide, an aluminum (Al) oxide, a niobium (Nb) oxide and a zirconium (Zr) oxide. These materials may have characteristics of an n-type semiconductor in which electrons act as majority carriers.

The binary oxide may be an amorphous structure, a crystalline structure, and/or a mixed structure of the amorphous and crystalline structures. If the n-type oxide layer 20 is a binary oxide it may be easily stacked on the p-type ferroelectric layer 10. The n-type oxide layer 20 may include an amorphous complex oxide having ternary or more components. The n-type oxide layer 20 may include a material made by adding (doping) at least one element to the binary oxide (e.g., GaInZnO and/or HfInZnO). Materials used for the p-type ferroelectric layer 10 and the n-type oxide layer 20 are not limited thereto. Various p-type ferroelectric materials and n-type semiconductor materials may be used. For example, the p-type ferroelectric layer 10 may be a non-oxide and/or a mixed material of a non-oxide and an oxide. The n-type oxide layer 20 may include a plurality of oxides that are different from each other. The p-type ferroelectric layer 10 and the n-type oxide layer 20 may respectively have a single-layer and/or multi-layer structure.

Thicknesses of the p-type ferroelectric layer 10 and the n-type oxide layer 20 may be about several tens to about several hundreds of nanometers (nm). The p-type ferroelectric layer 10 may be thicker than the n-type oxide layer 20. For example, the thickness of the p-type ferroelectric layer 10 may be about several to about several tens of times as large as that of the n-type oxide layer 20. The thickness of the p-type ferroelectric layer 10 may be about twice to about 20 times as large as that of the n-type oxide layer 20. If the thickness of the p-type ferroelectric layer 10 is in the range of about 200 nm to about 800 nm, the thickness of the n-type oxide layer 20 may be in the range of about 10 nm to about 400 nm. The thicknesses of the p-type ferroelectric layer 10 and the n-type oxide layer 20 may affect the characteristics (memory and switching characteristics) of the memory cell MC1.

If the p-type ferroelectric layer 10 is relatively thicker than the n-type oxide layer 20 (e.g., the n-type oxide layer 20 is relatively thin) the characteristics of the memory cell MC1 may be improved. Because the dielectric constant of the p-type ferroelectric layer 10 (e.g., in the range of about 500 to about 1000) is greater than that of the n-type oxide layer 20 (e.g., in the range of about 50 to about 100), by using a relatively thin n-type oxide layer 20, the difference between capacitances applied to the p-type ferroelectric layer 10 and the n-type oxide layer 20 may be reduced. If the p-type ferroelectric layer 10 is thinner than the n-type oxide layer 20, the capacitance of the p-type ferroelectric layer 10 may be excessively greater than that of the n-type oxide layer 20. The electrical characteristics caused by the n-type oxide layer 20 may be deteriorated. According to example embodiments, the difference between capacitances applied to the p-type ferroelectric layer 10 and the n-type oxide layer 20 may be reduced by using the p-type ferroelectric layer 10 that is relatively thicker than the n-type oxide layer 20.

The first electrode E1 may make an ohmic contact with the p-type ferroelectric layer 10. The second electrode E2 may make an ohmic contact with the n-type oxide layer 20. The first electrode E1 may be any material making an ohmic contact with the p-type ferroelectric layer 10. The second electrode E2 may be a material that makes an ohmic contact with the n-type oxide layer 20. An ohmic contact layer (not shown) may be between the first electrode E1 and the p-type ferroelectric layer 10 and/or an ohmic contact layer (not shown) may be disposed between the second electrode E2 and the n-type oxide layer 20. The materials of the first and second electrodes E1 and E2 may be any metal, conductive metal compound (e.g., metal oxide), and/or any mixture thereof which may be commonly used to make electrodes of semiconductor devices. The materials used to make the first and second electrodes E1 and E2 may be the same or different. The first and second electrodes E1 and E2 may have a single-layer and/or multi-layer structure. The first and second electrodes E1 and E2 may be regarded as portions of the memory cell MC1.

A memory device according to example embodiments may include a multi-functional memory cell MC1 having memory and switching characteristics. Generally, a memory device may use an intermediate electrode for connecting a memory element and a switching element. The intermediate electrode may be between the memory element and the switching element. A memory cell MC1 according to example embodiments may have memory and switching characteristics without an intermediate electrode. The memory cell MC1 may be an oxide unit including an oxide. If no intermediate electrode exists various good and/or improved effects may result. When the intermediate electrode is used as in general memory devices, it may be difficult to balance the characteristics of the memory element and the switching element since the characteristics of the memory element and the switching element are independent. Such a problem may become serious as the memory device is highly integrated.

For example, in order to obtain normal resistance change characteristics of a memory element in a highly integrated semiconductor device, it may be required to increase a forward current density of a switching element by increasing the size (width) of the switching element. The memory element may be programmed. If the size (width) of the switching element is increased, it may be difficult to scale down the memory device and/or manufacture the memory device. If the memory element and the switching element are separate units it may be difficult to satisfy the requirements of the switching element. The memory device may not be highly integrated and/or easily manufactured. According to example embodiments, a memory cell MC1 having memory and switching characteristics may include a p-type ferroelectric layer 10 directly in contact with an n-type oxide layer 20. Problems caused by having a separate memory and switching element may be overcome. A burden for satisfying the requirements of the switching element may be significantly reduced and/or improved. Even though the size of the memory cell MC1 is reduced, the functions of the memory cell MC1 (e.g., memory and switching functions) may be maintained. It may be easy to scale down and highly integrate the memory device. Because an intermediate electrode may not be used, a height of a memory cell MC1 may be reduced and/or the manufacturing process of the memory device may be simplified and/or improved.

Figure 2:
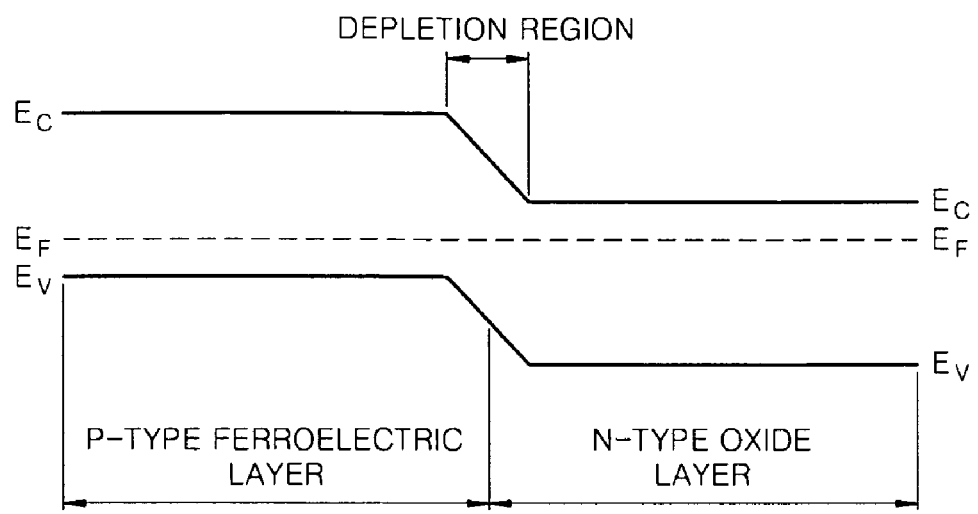
Figure 3:
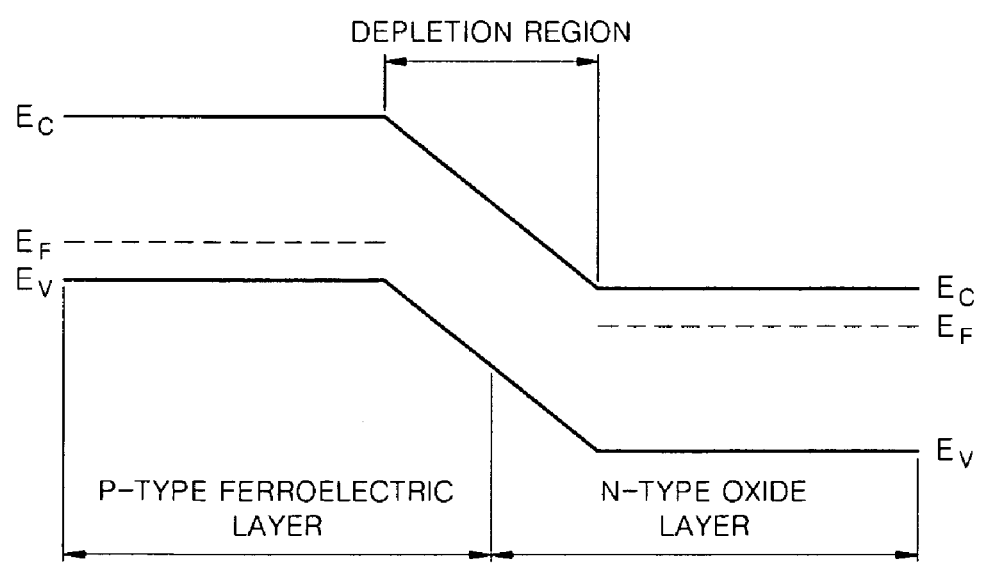

FIG. 2 is an energy band diagram of a p-type ferroelectric layer 10 and an n-type oxide layer 20 in an initial state before a voltage is applied to a memory cell MC1. In FIG. 2, each of $E_C$ and $E_V$ may be the lowest energy level of a conduction band and the highest energy level of a valence band. $E_F$ may indicate a Fermi energy level. FIG. 3 is an energy band diagram of a p-type ferroelectric layer 10 and n-type oxide layer 20 when a reverse bias is applied to a memory cell MC1. $E_C$, $E_V$ and $E_F$ may also be indicated in FIG. 3. Referring to FIG. 2, as the p-type ferroelectric layer 10 and the n-type oxide layer 20 are bonded to each other a depletion region may be in the junction therebetween.

FIG. 3 may illustrate an energy band diagram of the p-type ferroelectric layer 10 and n-type oxide layer 20 when a negative (−) voltage and a positive (+) voltage are applied to the first and second electrodes E1 and E2 of FIG. 1, respectively. Referring to FIG. 3, as the energy band of the n-type oxide layer 20 is lowered by the reverse bias, the depletion region may expand to increase a potential barrier. A rectification phenomenon where the current flow between the p-type ferroelectric layer 10 and the n-type oxide layer 20 is blocked and/or inhibited may occur. If a forward voltage is applied to the memory cell MC1 (e.g., if a positive (+) voltage and a negative (−) voltage are respectively applied to the first and second electrodes E1 and E2) the energy band of the n-type oxide layer 20 may be increased and a potential barrier between the p-type ferroelectric layer 10 and the n-type oxide layer 20 may be reduced so that the current easily flows through the memory cell MC1.

Figure 4:
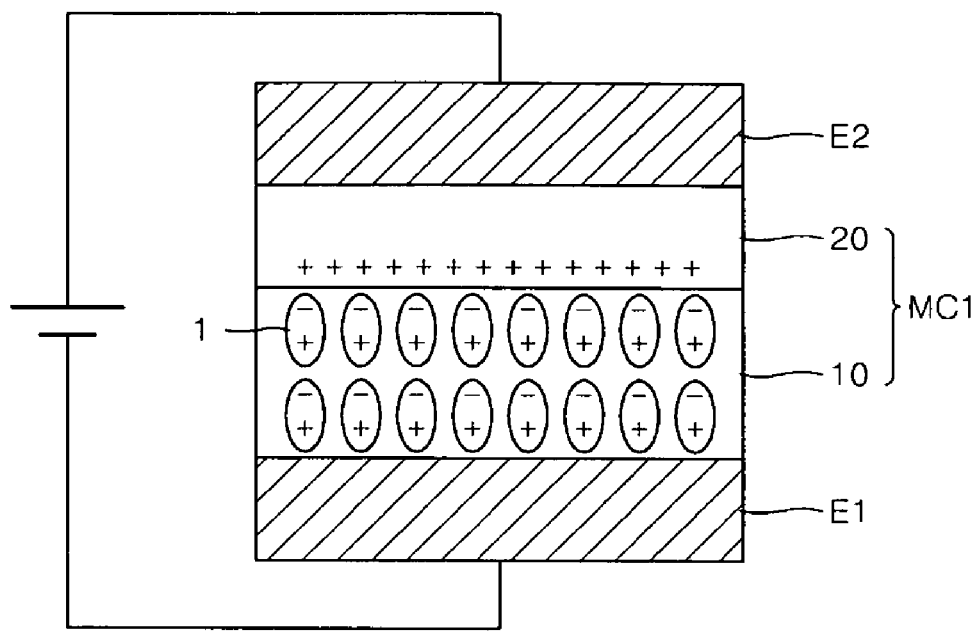
Figure 5:
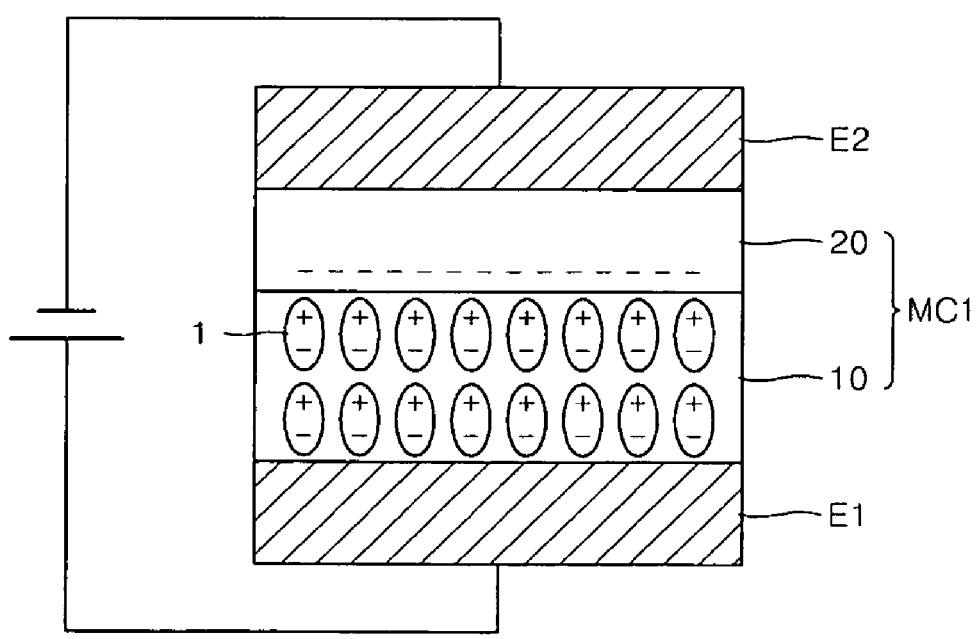

FIG. 4 is a cross-sectional diagram of the memory device of FIG. 1 illustrating a polarization state of the p-type ferroelectric layer 10 when a reverse bias is applied to the memory cell MC1. FIG. 5 is a cross-sectional diagram of the memory device of FIG. 1 illustrating a polarization state of the p-type ferroelectric layer 10 when a forward bias is applied to the memory cell MC1. Referring to FIG. 4, the p-type ferroelectric layer 10 may have a first polarization state when a reverse bias is applied to the memory cell MC1. In the first polarization state, the positive (+) end of dipoles 1 may be arranged toward the first electrode E1 and the negative (−) end of dipoles 1 may be arranged toward the second electrode E2. A portion of the n-type oxide layer 20 adjacent to the p-type ferroelectric layer 10 may have a positive (+) charge. Even though not shown herein, a portion of the p-type ferroelectric layer 10 adjacent to the n-type oxide layer 20 may have a negative (−) charge. A depletion region may be in the junction between the p-type ferroelectric layer 10 and the n-type oxide layer 20. Current flow between the p-type ferroelectric layer 10 and the n-type oxide layer 20 may be blocked and/or inhibited.

Referring to FIG. 5, the p-type ferroelectric layer 10 may have a second polarization state when a forward bias is applied to the memory cell MC1. In the second polarization state, the negative (−) end of dipoles 1 may be arranged toward the first electrode E1 and the positive (+) end of dipoles 1 may be arranged toward the second electrode E2. Because electrons are supplied to the n-type oxide layer 20 and holes are supplied to the p-type ferroelectric layer 10 by the forward voltage, electrons may flow in the direction from the second electrode E2 to the first electrode E1. A current may flow from the first electrode E1 to the second electrode E2 according to a (positive charge) current flow convention.

The memory cell MC1 of FIG. 4 may have different electrical resistance from the memory cell MC1 of FIG. 5. The memory cell MC1 of FIG. 4 may correspond to a low resistance state and the memory cell MC1 of FIG. 5 may correspond to a high resistance state. It is assumed that the resistance difference is mainly caused by the polarization difference of the p-type ferroelectric layer 10. However, there may be other factors to induce the resistance difference.

Figure 6:
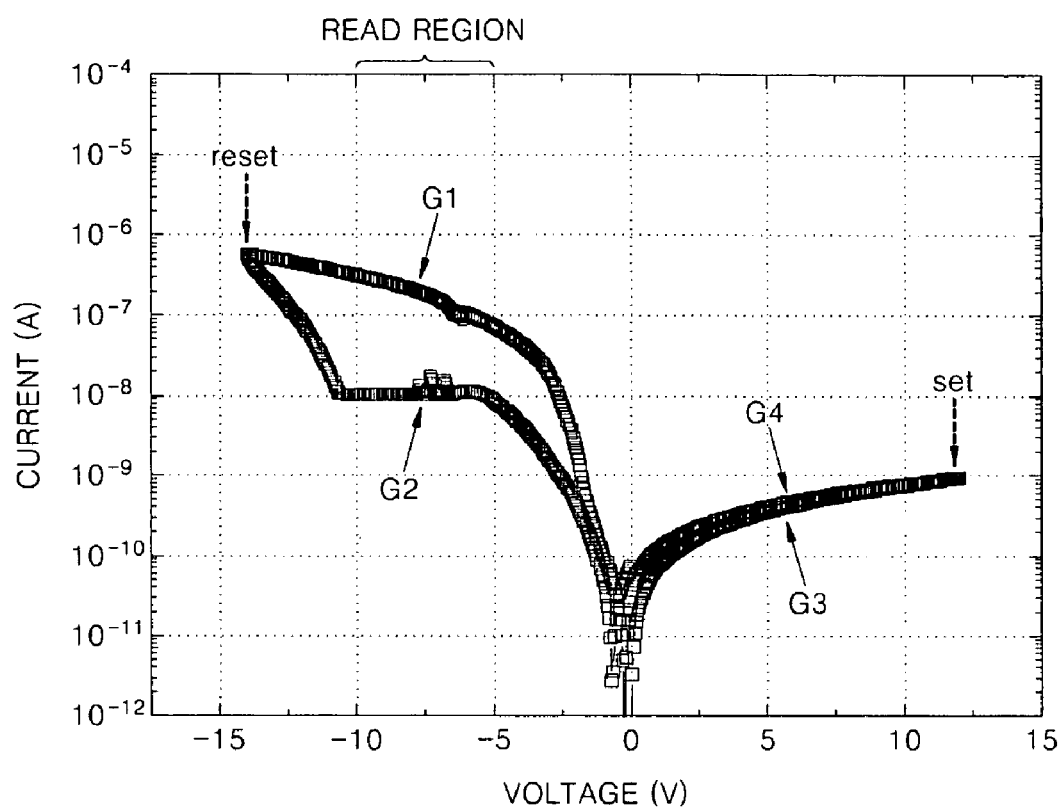

FIG. 6 is a graph illustrating voltage-current characteristics of a memory device according to example embodiments. The memory device may have a structure as shown in FIG. 1. A PbZrTiO layer (e.g., a PZT layer) may be a p-type ferroelectric layer 10 and a ZnO layer may be an n-type oxide layer 20. In FIG. 6, a voltage along the X axis may indicate a voltage applied to the second electrode E2. Zero (0) V may be applied to the first electrode E1.

Referring to FIG. 6, first and second graphs G1 and G2 which are on the negative (−) voltage side of FIG. 6 may illustrate characteristics when a forward bias is applied to the memory cell (PZT/ZnO structure). The first and second graphs G1 and G2 are distinguished from each other and may respectively correspond to ON and OFF states (e.g., low resistance state and high resistance state) of the memory cell. Third and fourth graphs G3 and G4 which are in the positive (+) voltage side may illustrate characteristics when a reverse bias is applied to the memory cell. The third and fourth graphs G3 and G4 are almost the same and thus may not be distinguished from each other. Current in the third and fourth graphs G3 and G4 may be very low and may be negligible. This is caused by the rectifying characteristic of the memory cell.

If the voltage decreases from zero (0) V in the negative (−) direction, the voltage-current characteristics may be illustrated as the first graph G1. If a voltage less than or equal to a reset voltage is applied to the memory cell the voltage-current characteristics may be illustrated as the second graph G2 (e.g., high resistance state). If the voltage increases toward the positive (+) direction the voltage-current characteristics may be illustrated as the first graph G3. If a voltage greater than or equal to a set voltage is applied the voltage-current characteristics may be illustrated as the second graph G4. If the voltage decreases in the negative (−) direction the voltage-current characteristics may be illustrated as the first graph G1 (e.g., a low resistance state). The memory cell may have the low resistance state corresponding to the first graph G1 and the high resistance state corresponding to the second graph G2 according to the voltage applied thereto.

A reset operation of changing from the low resistance state corresponding to the first graph G1 into the high resistance state corresponding to the second graph G2 may be performed while the polarization of the p-type ferroelectric layer is inverted. The polarization of the p-type ferroelectric layer may be converted from the state shown in FIG. 4 to the state shown in FIG. 5 by the reset voltage so that the resistance state of the memory cell may be converted from the low resistance state into the high resistance state. The resistance state of the memory cell may be converted from the high resistance state into the low resistance state again by the set voltage. This may indicate that the polarization of the p-type ferroelectric layer is converted from the state shown in FIG. 5 to the state shown in FIG. 4 by the set voltage. The positive (+) and negative (−) voltages may be used to set and reset the memory cell. The memory cell according to example embodiments may have bipolar memory characteristics.

The set operation described above may be an operation of changing the memory cell into the low resistance state and may be regarded as a write operation of a first data. The reset operation described above may be an operation of changing the memory cell into the high resistance state and may be regarded as a write operation of a second data. The write operation of the second data may be regarded as an erase operation of the first data. The write operation of the first data may be regarded as an erase operation of the second data. The set and reset concepts may be exchanged. A read operation of data written in the memory cell may include measuring electrical resistance of the memory cell by applying a read voltage to the memory cell. In FIG. 6, the read voltage may be in the range of about −10V to about −5V. If the measured electrical resistance is low the data written in the memory cell may be the first data. If the measured electrical resistance is high the data written in the memory cell may be the second data.

The memory device according to example embodiments may use a resistance change of the memory cell according to the polarization change of the p-type ferroelectric layer. Even though a general ferroelectric random access memory (FRAM) uses ferroelectric materials, a resistance change according to the polarization change of the ferroelectric material is not measured but the degree of polarization of the ferroelectric material is measured. Based on this characteristic, the read method of the memory device according to the present embodiment is different from a general FRAM.

A method of operating the memory device according to example embodiments will be described with reference to FIGS. 4 to 6. A method of operating a memory device according to example embodiments may include applying a first voltage to a memory cell MC1 so that the p-type ferroelectric layer 10 has a first polarization state and applying a second voltage to the memory cell MC1 so that the p-type ferroelectric layer 10 has a second polarization state. One of the first and second voltages may be a positive (+) voltage and the other may be a negative (−) voltage. For example, the memory cell MC1 may have the state shown in FIG. 4 by applying the first voltage and have the state shown in FIG. 5 by applying the second voltage. The applying of the first voltage and the second voltage may be regarded as a write or erase operation. The method may further include reading data of the memory cell MC1. The reading data of the memory cell MC1 may include measuring electrical resistance of the memory cell MC1. The electrical resistance of the memory cell MC1 may vary according to a polarization state of the p-type ferroelectric layer 10.

Figure 7:
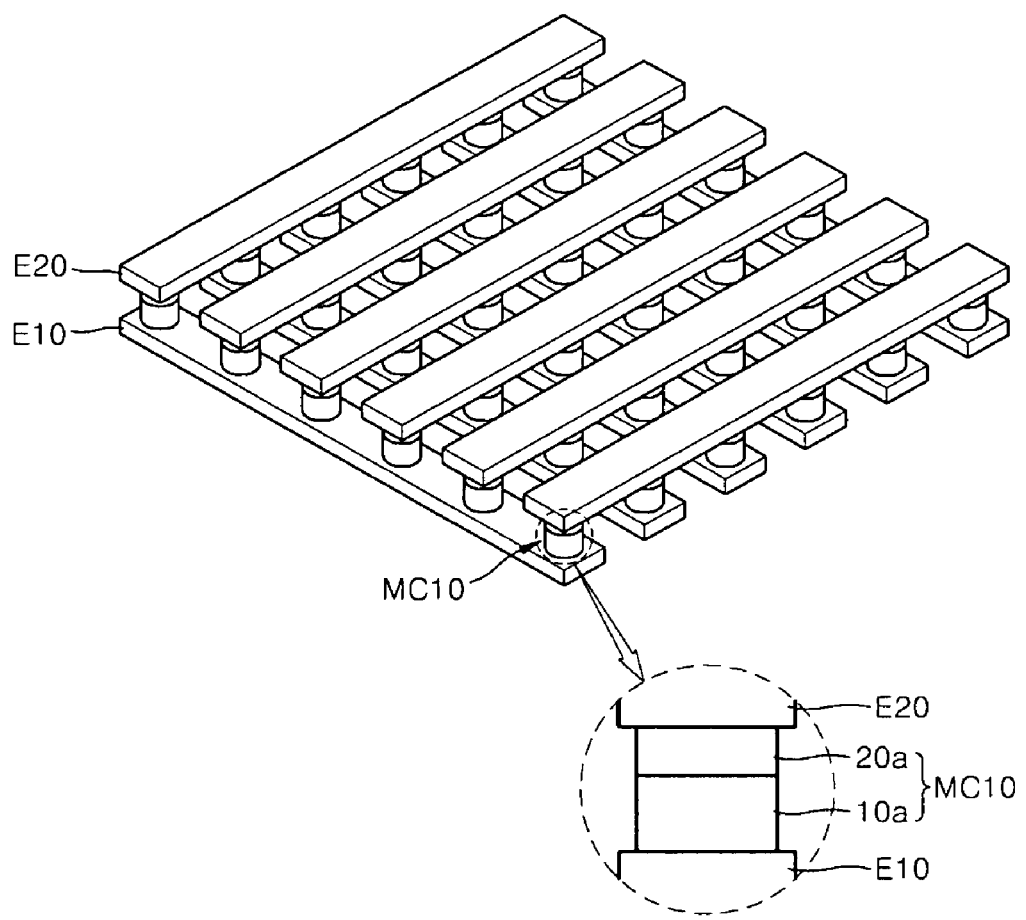

FIG. 7 is a perspective view of a memory device having an array structure according to example embodiments. The memory device may be a multi-layer cross-point memory device having the memory cell MC1 of FIG. 1. Referring to FIG. 7, a plurality of first electrodes E10 having a wire shape may be aligned parallel to each other. The first electrodes E10 may extend in a first direction, for example, in the X axis direction. A plurality of second electrodes E20 that are spaced apart from the first electrodes E10 and have a wire shape may be aligned parallel to each other. The second electrodes E20 and the first electrodes E10 may cross each other. For example, the second electrodes E20 and the first electrodes E10 may be aligned perpendicular to each other. The second electrodes E20 may extend in a Y axis direction as shown in FIG. 7. The directions of the first and second electrodes E10 and E20 may be exchanged and the shapes of the first and second electrodes E10 and E20 may be modified in various ways. Materials of the first and second electrodes E10 and E20 and the configurations thereof may be, for example, the same as those of the first and second electrodes E1 and E2 described with reference to FIG. 1.

A first memory cell MC10 may be positioned at each cross-point between the first electrodes E10 and the second electrodes E20. The first memory cell MC10 may have the same structure as the memory cell MC1 shown in FIG. 1. The memory cell MC10 may include a p-type ferroelectric layer 10*a* and an n-type semiconductor oxide layer (hereinafter referred to as "n-type oxide layer") 20*a* on the first electrode E10. The p-type ferroelectric layer 10*a* and the n-type oxide layer 20*a* of FIG. 7 may respectively correspond to the p-type ferroelectric layer 10 and the n-type oxide layer 20 shown in FIG. 1. The positions of the p-type ferroelectric layer 10*a* and the n-type oxide layer 20*a* may be exchanged. The configuration of the first memory cell MC10 may be modified in various ways as described above.

Figure 8:
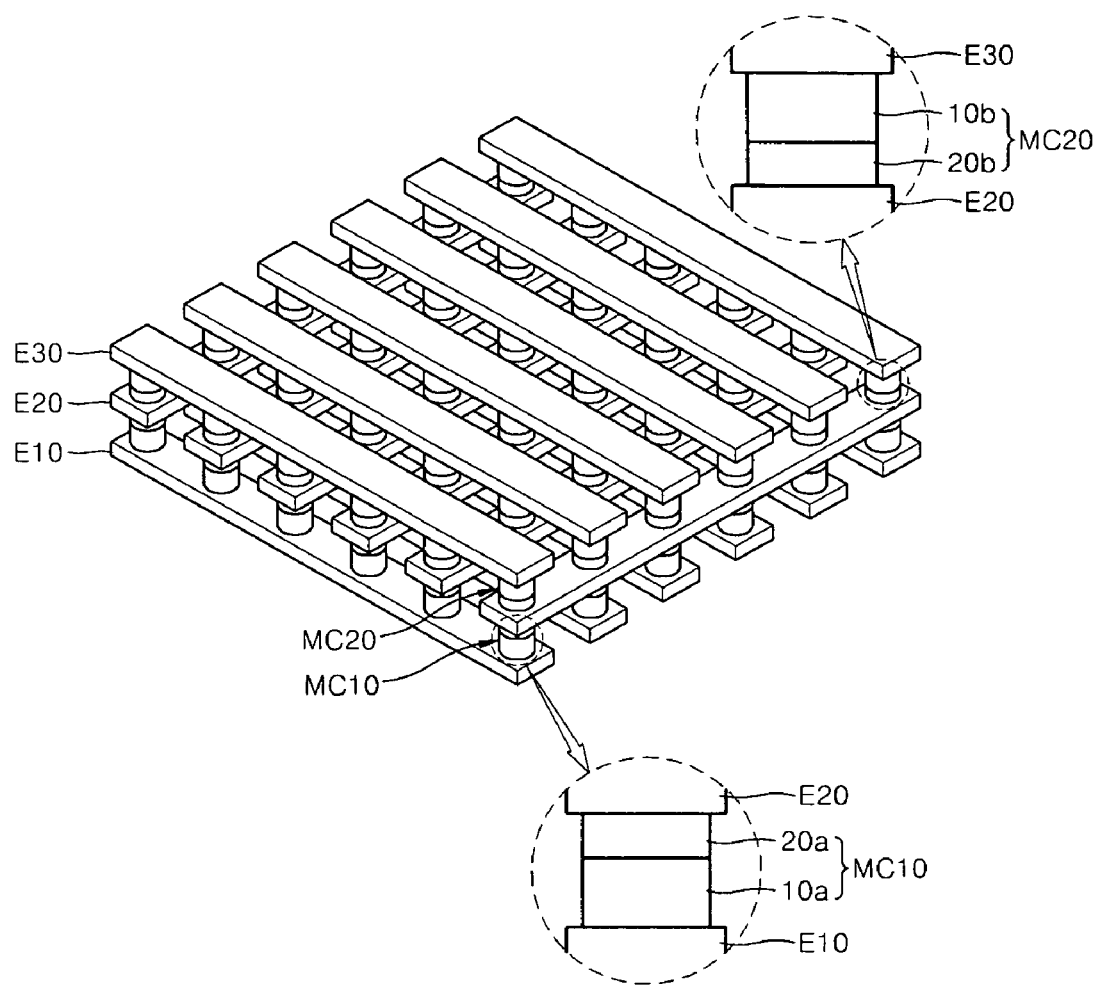

Additional memory cells and electrodes may be on the second electrodes E20 of FIG. 7. FIG. 8 is a perspective view of a memory device having an array structure according to example embodiments. Referring to FIG. 8, a plurality of third electrodes E30 may be spaced apart from the upper surface of the second electrodes E20. The third electrodes E30 may have a wire shape and be aligned parallel to each other. The third electrodes E30 and the second electrodes E20 may cross each other, for example, may be aligned perpendicular to each other. Materials of the third electrodes E30 and the configuration thereof may be the same as or similar to those of the first and second electrodes E10 and E20. A second memory cell MC20 may be positioned at each cross-point between the second electrodes E20 and the third electrodes E30. The second memory cell MC20 may include a p-type ferroelectric layer 10*b* and an n-type semiconductor oxide layer (hereinafter referred to as "n-type oxide layer") 20*b* which are bonded to each other. Materials used for the p-type ferroelectric layer 10*b* and the n-type oxide layer 20*b* of FIG. 8 may respectively be the same as those of the p-type ferroelectric layer 10 and the n-type oxide layer 20 shown in FIG. 1.

The second memory cell MC20 may have the same structure as or an inversed stack structure of the first memory cell MC1. FIG. 8 is a perspective view of a memory device in which the second memory cell MC20 has an inversed structure of the first memory cell MC10. The second memory cell MC20 includes the n-type oxide layer 20*b* and the p-type ferroelectric layer 10*b* on the second electrodes E20. Because the memory cells MC10 and MC20 may be symmetric based on the second electrodes E20, data may be simultaneously written in the two memory cells MC10 and MC20 using the second electrodes E20 as a common bit line. In the second memory cell MC20 according to example embodiments the positions of the n-type oxide layer 20*b* and the p-type ferroelectric layer 10*b* may be exchanged. The second memory cell MC20 may have the same stack structure as the first memory cell MC10. Data may be written in one of the memory cells MC10 and MC20 in one programming operation.

Even though the first and second memory cells MC10 and MC20 of FIGS. 7 and 8 have a cylindrical shape, they may also have, for example, various shapes such as a square pillar shape and/or a pillar shape of which width increases in the downward direction. For example, the first and second memory cells MC10 and MC20 may externally extend from the cross-points of the first and second electrodes E10 and E20 and the cross-points of the second and third electrodes E20 and E30. Although not shown herein, the memory device of FIG. 8 may further include, for example, a structure that is the same as the stack structure that includes the first memory cell MC10 and the second electrode E20, on the third electrode E30.

The memory device of FIG. 8 may further include at least one set of a structure that is the same as the stack structure that includes the first memory cell MC10, the second electrode E20, the second memory cell MC20, and the third electrode E30, on the third electrode E30. The memory device of FIG. 8 may further include at least one set of a structure that is the same as the stack structure that includes the first memory cell MC10, the second electrode E20, the second memory cell MC20, the third electrode E30, the first memory cell MC10, and the second electrode E20, which are sequentially stacked, on the third electrode E30.

The multi-layer cross-point memory devices as shown in FIGS. 7 and 8 may be highly integrated. A highly integrated memory device having a large and/or increased capacity may be manufactured by crossing the electrodes E10 to E30 with each other, disposing the memory cells MC10 and MC20 at each cross-point thereof, and repeatedly stacking this structure.

Figure 9:
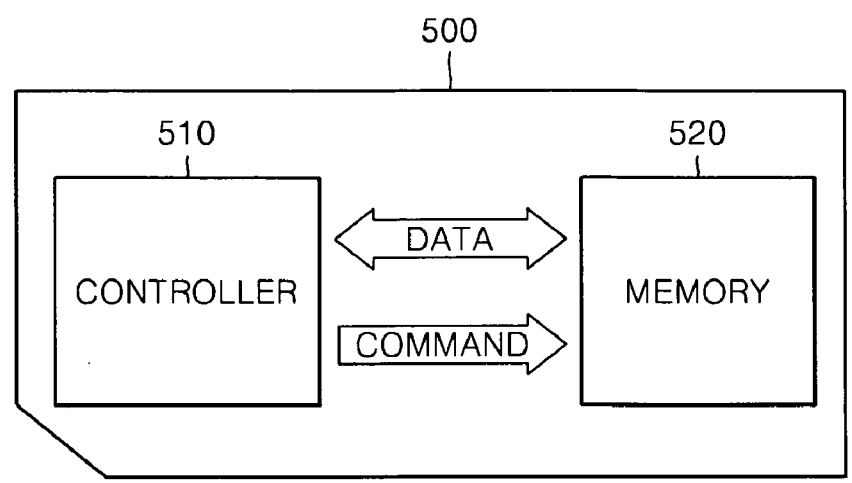

FIG. 9 is a schematic diagram illustrating a memory card 500 according to example embodiments. Referring to FIG. 9, a controller 510 and a memory 520 may exchange electric signals. For example, according to commands of the controller 510, the memory 520 and the controller 510 may exchange data. Accordingly, the memory card 500 may either store data in the memory 520 or output data from the memory 520. The memory 520 may include one of the non-volatile memory devices described above in reference to FIGS. 1-8.

Such a memory card 500 may be used as a storage medium for various portable electronic devices. For example, the memory card 500 may be a multimedia card (MMC) or a secure digital (SD) card.

Figure 10:
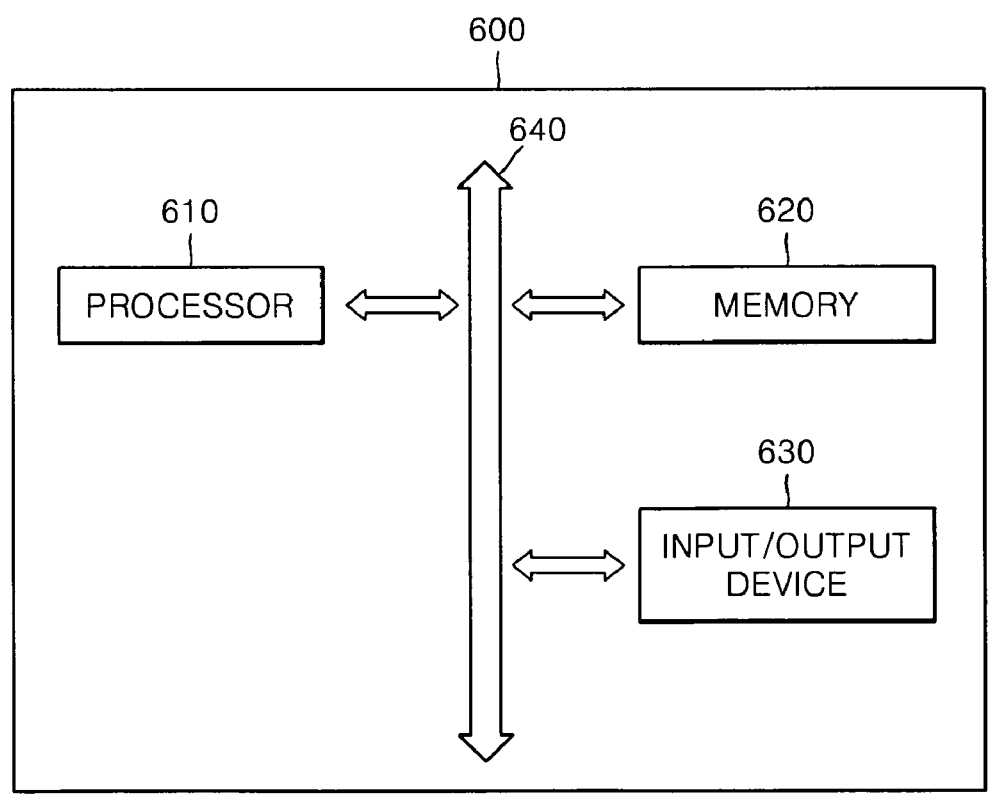

FIG. 10 is a block diagram roughly illustrating an electronic system 600 according to example embodiments. Referring to FIG. 10, a processor 610, an input/output device 630, and a memory 620 may perform data communication with each other by using a bus 640. The processor 610 may execute a program and control the electronic system 600. The input/output device 630 may be used to input/output data to/from the electronic system 600. The electronic system 600 may be connected to an external device, e.g. a personal computer or a network, by using the input/output device 630 and may exchange data with the external device.

The memory 620 may store codes or programs for operations of the processor 610. For example, the memory 620 may include one of the non-volatile memory devices described above in reference to FIGS. 1-8.

For example, such an electronic system 600 may embody various electronic control systems requiring the memory 620, and, for example, may be used in mobile phones, MP3 players, navigation devices, solid state disks (SSD), or household appliances.

While example embodiments have been particularly shown and described, it will be understood by one of ordinary skill in the art that variations in form and detail may be made therein without departing from the spirit and scope of the claims. For example, the memory cell of FIG. 1 may be applied to memory devices having various structures in addition to the cross-point memory devices shown in FIGS. 7 and 8.

What is claimed is:

1. A memory device, comprising:
   a first memory cell including a p-type ferroelectric layer and an n-type oxide semiconductor layer, a depletion region at a junction between the p-type ferroelectric layer and the n-type oxide semiconductor layer;
   a first electrode connected to the p-type ferroelectric layer; and
   a second electrode connected to the n-type oxide semiconductor layer.

2. The memory device of claim 1, wherein the p-type ferroelectric layer includes an oxide.

3. The memory device of claim 2, wherein the p-type ferroelectric layer includes at least one of PbZrTiO, BaTiO, PbTiO, BiLaTiO, BiTiNbO, PbGeO, PbMnTeO, PbCoTeO, PbMnReO, and PbMnNbO.

4. The memory device of claim 1, wherein the n-type oxide semiconductor layer includes a binary oxide.

5. The memory device of claim 4, wherein the n-type oxide semiconductor layer includes at least one of a zinc (Zn) oxide, a titanium (Ti) oxide, a tantalum (Ta) oxide, a hafnium (Hf) oxide, a tungsten (W) oxide, an aluminum (Al) oxide, a niobium (Nb) oxide, and a zirconium (Zr) oxide.

6. The memory device of claim 1, wherein the n-type oxide semiconductor layer includes an amorphous complex oxide including three or more components.

7. The memory device of claim 1, wherein the p-type ferroelectric layer is thicker than the n-type oxide semiconductor layer.

8. The memory device of claim 7, wherein a thickness of the p-type ferroelectric layer is about 2 to about 20 times greater than a thickness of the n-type oxide semiconductor layer.

9. The memory device of claim 1, wherein the first electrode makes an ohmic contact with the p-type ferroelectric layer, and the second electrode makes an ohmic contact with the n-type oxide semiconductor layer.

10. The memory device of claim 1, wherein the first electrode is a plurality of first electrodes that are wire shaped and aligned about parallel to each other,
    the second electrode is a plurality of second electrodes that are wire shaped and aligned about parallel to each other, the second electrodes crossing the first electrodes, and
    the first memory cell is a plurality of first memory cells, one of the first memory cells at each cross-point between the first and second electrodes.

11. The memory device of claim 10, further comprising;
    a plurality of third electrodes that are wire shaped and aligned about parallel to each other, the third electrodes crossing the second electrodes; and
    a plurality of second memory cells, one of the second memory cells at each cross-point between the second and third electrodes, each of the second memory cells including a p-type ferroelectric layer and an n-type oxide semiconductor layer.

12. The memory device of claim 11, wherein the second memory cells are one of a same stack structure and an inverse stack structure of the first memory cells.

13. A method of operating the memory device of claim 1, the method comprising:
applying a first voltage to the first memory cell to set the p-type ferroelectric layer to a first polarization state; and
applying a second voltage to the first memory cell to set the p-type ferroelectric layer to a second polarization state.

14. The method of claim 13, wherein one of the first and second voltages is a positive (+) voltage and the other is a negative (−) voltage.

15. The method of claim 13, wherein the applying of the first voltage and the second voltage is one of a data write operation and a data erase operation.

16. The method of claim 13, further comprising:
reading data of the first memory cell by measuring an electrical resistance of the first memory cell, the electrical resistance of the first memory cell varying according to the polarization of the p-type ferroelectric layer.

17. A memory card comprising the memory device of claim 1.

18. An electronic system comprising the memory device of claim 1.

* * * * *